United States Patent
Zhang

(10) Patent No.: US 12,387,769 B2
(45) Date of Patent: Aug. 12, 2025

(54) LATENCY ADJUSTMENT METHOD, MEMORY CHIP ARCHITECTURE, AND SEMICONDUCTOR MEMORY

(71) Applicant: CHANGXIN MEMORY TECHNOLOGIES, INC., Hefei (CN)

(72) Inventor: Hongguang Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 260 days.

(21) Appl. No.: 18/156,461

(22) Filed: Jan. 19, 2023

(65) Prior Publication Data

US 2023/0377620 A1 Nov. 23, 2023

Related U.S. Application Data

(63) Continuation of application No. PCT/CN2022/100819, filed on Jun. 23, 2022.

(30) Foreign Application Priority Data

May 23, 2022 (CN) .......................... 202210563795.1

(51) Int. Cl.
*G11C 8/00* (2006.01)
*G11C 7/10* (2006.01)
*G11C 7/22* (2006.01)

(52) U.S. Cl.
CPC ............ *G11C 7/222* (2013.01); *G11C 7/1039* (2013.01); *G11C 7/1093* (2013.01)

(58) Field of Classification Search
CPC ...... G11C 7/222; G11C 7/1039; G11C 7/1093
USPC ....................................................... 365/233
See application file for complete search history.

(56) References Cited

U.S. PATENT DOCUMENTS

| | | | | |
|---|---|---|---|---|
| 7,222,224 B2* | 5/2007 | Woo | ...................... | G06F 13/161 |
| | | | | 711/170 |
| 7,298,667 B2* | 11/2007 | Oh | ........................ | G11C 29/023 |
| | | | | 365/194 |
| 7,590,013 B2* | 9/2009 | Yu | ........................ | G11C 7/1045 |
| | | | | 365/194 |
| 7,760,635 B2* | 7/2010 | Greenfield | ........... | H04M 11/062 |
| | | | | 370/465 |
| 7,934,057 B1* | 4/2011 | Raza | ................... | G06F 13/1673 |
| | | | | 711/149 |
| 8,181,083 B2* | 5/2012 | Rovini | ................. | H03M 13/114 |
| | | | | 714/758 |
| 8,959,537 B2* | 2/2015 | Lang | ....................... | G06F 9/547 |
| | | | | 719/330 |
| 9,143,315 B2* | 9/2015 | Buckler | .................. | H03J 1/005 |
| 9,191,016 B2* | 11/2015 | Griffin | .................... | H03L 7/095 |

(Continued)

FOREIGN PATENT DOCUMENTS

| | | |
|---|---|---|
| CN | 108091357 A | 5/2018 |
| CN | 109446708 A | 3/2019 |

(Continued)

*Primary Examiner* — Viet Q Nguyen
(74) *Attorney, Agent, or Firm* — Syncoda LLC; Feng Ma

(57) ABSTRACT

A latency adjustment method, a memory chip architecture, and a semiconductor memory are provided. The method includes: measuring a first latency of a first signal path; performing decoding based on the first latency to obtain a number of latency cycles, where the number of latency cycles represents a ratio of the first latency to a clock cycle; and controlling a second latency of a second signal path to be an integer multiple of the clock cycle based on the number of latency cycles.

17 Claims, 5 Drawing Sheets

(56) References Cited

U.S. PATENT DOCUMENTS

| | | | |
|---|---|---|---|
| 9,318,172 B2* | 4/2016 | Kim | G11C 16/10 |
| 9,373,776 B2* | 6/2016 | Nagase | H01F 10/3272 |
| 9,443,565 B2 | 9/2016 | Jung | |
| 10,026,462 B1 | 7/2018 | Ma | |
| 10,134,485 B2* | 11/2018 | Kim | G11C 8/10 |
| 10,600,458 B2* | 3/2020 | Jeon | H03L 7/0814 |
| 11,099,601 B2* | 8/2021 | Carlough | G06F 1/10 |
| 11,146,293 B2* | 10/2021 | Stanisavljevic | H03M 13/153 |
| 11,811,905 B1* | 11/2023 | Logelin | H04L 7/0037 |
| 11,935,578 B2* | 3/2024 | Stephens, Jr. | G11C 29/023 |
| 2008/0157753 A1* | 7/2008 | Boucard | H04L 43/00 |
| | | | 324/149 |
| 2009/0072856 A1* | 3/2009 | Subramaniam | G06F 13/1668 |
| | | | 326/38 |
| 2009/0177849 A1* | 7/2009 | Mazzola | G06F 13/4234 |
| | | | 711/E12.001 |
| 2012/0269015 A1* | 10/2012 | Bringivijayaraghavan | |
| | | | G11C 7/22 |
| | | | 365/194 |
| 2013/0117599 A1* | 5/2013 | Mochida | G11C 11/4076 |
| | | | 713/503 |
| 2013/0182516 A1* | 7/2013 | Kinoshita | G11C 8/18 |
| | | | 365/194 |
| 2018/0013541 A1 | 1/2018 | Huang et al. | |
| 2018/0053567 A1* | 2/2018 | Kim | G11C 29/022 |
| 2018/0144781 A1 | 5/2018 | Lim | |
| 2018/0336940 A1 | 11/2018 | Ma et al. | |
| 2019/0129637 A1* | 5/2019 | Gans | G11C 7/1072 |
| 2019/0333554 A1 | 10/2019 | Ma et al. | |
| 2021/0201964 A1 | 7/2021 | Kim et al. | |
| 2021/0320664 A1 | 10/2021 | Kavala et al. | |
| 2023/0315297 A1* | 10/2023 | Oh | G11C 11/4076 |
| | | | 711/154 |

FOREIGN PATENT DOCUMENTS

| | | | | |
|---|---|---|---|---|
| CN | 110622245 A | 12/2019 | | |
| CN | 113517880 A | 10/2021 | | |
| JP | 2007012244 A | * | 1/2007 | G11C 11/34 |

* cited by examiner

LATENCY ADJUSTMENT METHOD, MEMORY CHIP ARCHITECTURE, AND SEMICONDUCTOR MEMORY

CROSS-REFERENCE TO RELATED APPLICATION

This is a continuation application of International Patent Application No. PCT/CN2022/100819, filed on Jun. 23, 2022, which is based upon and claims priority to Chinese Patent Application No. 202210563795.1, filed on May 23, 2022. The present disclosures of International Patent Application No. PCT/CN2022/100819 and Chinese Patent Application No. 202210563795.1 are hereby incorporated by reference in their entireties.

BACKGROUND

With the continuous development of a semiconductor technology, when devices such as computers are manufactured and used by people, higher and higher requirements are proposed for the transmission speed of data. In order to obtain a faster data transmission speed, a series of devices such as memories that can transmit data at Double Data Rate (DDR) are merged as the times require.

In the design of DDR transmission, an On Die Termination (ODT) path is added. In short, a resistance value of a Termination Resistance (RTT) may be switched, and the way of switching is required to follow a certain timing sequence. For example, the state of an ODT pin on a memory chip may control the value of the RTT.

However, the added signal path brings the problem of difficult synchronization, which increases the risks of signal transmission errors.

SUMMARY

The present disclosure relates to the field of integrated circuits, and in particular, to a latency adjustment method, a memory chip architecture, and a semiconductor memory. In view of this, embodiments of the present disclosure provide a latency adjustment method, a memory chip architecture, and a semiconductor memory.

The technical solutions of the embodiments of the present disclosure are implemented as follows.

According to an embodiment of the present disclosure, there is provided a latency adjustment method, including the following operations.

A first latency of a first signal path is measured.

Decoding is performed based on the first latency to obtain a number of latency cycles. The number of latency cycles represents a ratio of the first latency to a clock cycle.

A second latency of a second signal path is controlled to be an integer multiple of the clock cycle based on the number of latency cycles.

load componentload componentload componentload componentload componentload componentload componentload component According to an embodiment of the present disclosure, there is further provided a memory chip architecture. The memory chip architecture includes a first signal path, a second signal path and a latency adjustment apparatus. The latency adjustment apparatus includes a latency measurement component, a latency decoding component, and a self-align control component.

The latency measurement component is configured to measure a first latency of the first signal path.

The latency decoding unit is configured to perform decoding based on the first latency to obtain a number of latency cycles. The number of latency cycles represents a ratio of the first latency to a clock cycle.

The self-align control component is configured to receive the number of latency cycles, and control a second latency of the second signal path to be an integer multiple of the clock cycle based on the number of latency cycles.

control componentlatency control assemblylatency control assemblylatency control assemblyload componentload componentlatency control assemblyload componentload componentsub-componentsub-componentsub-componentload componentsub-componentsub-componentload componentenable componentenable componentlatency control assemblylatency control assembly According to an embodiment of the present disclosure, there is further provided a semiconductor memory. The semiconductor memory includes the memory chip architecture in the above solution.

DETAILED DESCRIPTION

Figure 1:
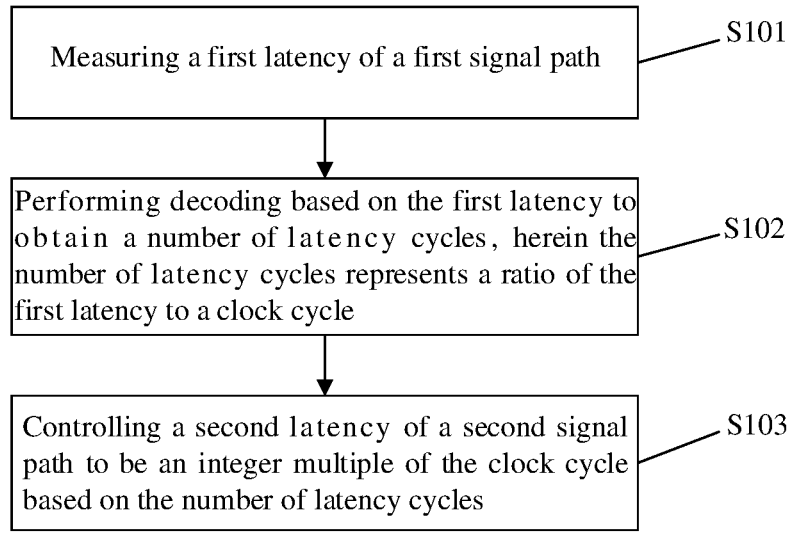
FIG. 1 is a first flowchart of a latency adjustment method according to an embodiment of the present disclosure.

For making the purposes, technical solutions and advantages of the present disclosure clearer, the technical solutions of the present disclosure are further described below with reference to the drawings and embodiments in detail. The described embodiments should not be considered as limits to the present disclosure. All other embodiments obtained by those of ordinary skill in the art without creative work shall fall within the scope of protection of the present disclosure.

"Some embodiments" involved in the following descriptions describes a subset of all possible embodiments. However, it can be understood that "some embodiments" may be the same subset or different subsets of all the possible embodiments, and may be combined without conflicts.

If a similar description of "first/second" appears in the present disclosure, the following description is added. Term "first/second/third" involved is only for distinguishing similar objects and does not represent a specific sequence of the objects. It can be understood that "first/second/third" may be interchanged to specific sequences or orders if allowed to implement the embodiments of the present disclosure described herein in sequences except the illustrated or described ones.

Unless otherwise defined, all technical and scientific terms in the specification have the same meaning as those skilled in the art, belonging to the present disclosure, usually understand. Terms used in the specification are only used for describing the purpose of the present disclosure, but not intended to limit the present disclosure.

With the rapid development of a semiconductor technology, more and more signal paths are used in a chip. The timing sequences of transmission signals on different signal paths are required to be aligned with each other. That is to say, different signal paths are required to be synchronized. Taking a Synchronous Dynamic Random Access Memory (SDRAM) as an example, the SDRAM includes a plurality of signal paths such as Delay-Locked Loop (DLL), read, write, and On Die Termination (ODT) paths. Since the SDRAM is a synchronous device, physical latency of each path should be controlled to be an integer multiple of a clock cycle, so that edges of clock signals passing through respective paths can be aligned. The physical latency includes route path latency and circuit latency, and therefore, each path needs to meet the following:

$$\alpha L + \beta M = N^* t_{CK} \quad (1)$$

In the above equation, $\alpha L$ represent the route path latency, where $\alpha$ is a latency of route path per unit, and L is a route path length of each path (in um); $\beta M$ represents the circuit latency, where $\beta$ is a latency of a circuit at each stage, and M is the stage number of the circuit of each path; and $t_{CK}$ represents the clock cycle, and N is a positive integer.

In the physical latency, the circuit latency is more sensitive than the route path latency, and is more susceptible to Process, Voltage, Temperature (PVT) conditions. A process corner is an operating condition of the circuit during an actual operation. Different process corners represent different PVT conditions. At certain process corners, such as at a fast corner, the circuit latency can be relatively stable as a clock frequency changes. In some other process corners, such as at a typical corner or a worst corner, the circuit latency may be largely changed as the clock frequency changes. That is to say, the circuit latency is difficult to maintain stable. Therefore, the PVT condition has a non-negligible impact on the circuit latency.

It is to be noted that, under a poorer PVT condition, that is, at a slow corner and when a voltage is low and a temperature is high, the physical latency of the read, write and OTD paths is shorter than that of the DLL path. Since clock signals of the read, write and OTD paths need to wait to be enabled, compared with DLL, the circuit stages of the above paths are relatively small, and route metal lengths are relatively long. Generally, when the process corner is the typical corner, the clock signals of the read, write and OTD paths are adjusted and balanced. However, there is no guarantee that the physical latencies of different paths can match at all process corners.

FIG. 1 is an optional schematic flowchart of a latency adjustment method according to an embodiment of the present disclosure. Description is performed with reference to operations illustrated in FIG. 1. It is to be noted that, the latency adjustment method in this embodiment of the present disclosure may be performed by a latency adjustment apparatus.

At S101, a first latency of a first signal path is measured.

In this embodiment of the present disclosure, the latency adjustment apparatus may measure the first latency of the first signal path. The first signal path may be a DLL.

It is to be noted that, the DLL is a feedback control circuit, which may automatically adjust the latency of an output signal, so as to cause the phase of the output signal to be consistent with that of an input signal, that is, to cause the output signal to delay an integer number of cycles relative to the input signal. Specifically, the DLL may control the latency and phase of an oscillation signal inside the loop according to the input signal, so that the automatic tracking of the output signal to the input signal can be realized. The output signal and the input signal maintain a fixed phase difference. That is to say, the phase difference of the output signal and the input signal are locked, which are not affected by the PVT conditions. Therefore, the DLL may adjust the latency of the clock signal, and may control the output clock signal to delay an integer multiple of the clock cycle relative to the input clock signal, that is, the first latency is the integer multiple of the clock cycle.

It is to be noted that, when the PVT condition is poorer, that is, at the slow corner and when the voltage is reduced and the temperature is increased, the loop latency (that is, the first latency) of the DLL path is increased. The loop latency is the physical latency from a clock pin (CKT pad) to a data pin (DQS pad), which includes a clock signal receiver (Clock Buffer), a Coarse delay line (CDL), a Fine delay line (FDL), a clock tree and a DQ drive circuit. Most circuits are of fixed stages, and the physical latency depends on the PVT condition.

At S102, decoding is performed based on the first latency to obtain a number of latency cycles. The number of latency cycles represents a ratio of the first latency to a clock cycle.

In this embodiment of the present disclosure, after the latency adjustment apparatus measures the first latency, the first latency is decoded to obtain the number N of latency cycles that corresponds to the first latency, that is, a ratio of the first latency to the clock cycle. Since the first latency is the integer multiple of the clock cycle, the number N of latency cycles is a positive integer. It is to be noted that, if the first latency is the loop latency, the number of latency cycles is a loop delay number.

At S103, a second latency of a second signal path is controlled to be an integer multiple of the clock cycle based on the number of latency cycles.

In this embodiment of the present disclosure, the second signal path may be an ODT path, and the ODT path includes an ODT resistor. During signal transmission, the ODT resistor performs impedance matching on a transmission line, to reduce the energy loss and reflection of a signal during transmission, so as to guarantee the integration of the signal received by a receiving end. In order to achieve the function of the ODT resistor, the ODT path includes a certain number of logic circuits. These logic circuits generate circuit latency, and the circuit latency also has a large difference at different process corners. Therefore, the latency of the ODT path is required to be adjusted, to make the ODT path synchronized with other paths. That is to say, the impact of the PVT condition on the physical latency of the ODT path is required to be reduced, and PVT tolerance of the ODT path is required to be increased.

In this embodiment of the present disclosure, after the latency adjustment apparatus determines the number N of latency cycles, the second latency of the second signal path can be controlled to cause the second latency to reach the integer multiple of the clock cycle. That is to say, the latency adjustment apparatus may adjust the second latency by matching the number N of latency cycles of the first latency. Since the first latency meets a synchronization requirement of the signal path, the adjusted second latency may also meet the synchronization requirement of the signal path.

It should be understood that, the second latency is adjusted by matching the number of latency cycles of the first latency, so that the ratio of the second latency to the clock cycle is an integer. In this way, different signal paths can be synchronized. Therefore, chip latency may meet design requirements, thereby reducing the risk of signal transmission errors in a chip.

In some embodiments of the present disclosure, the second signal path includes at least one load component. The second latency includes an adjustable latency. The operation at S103 illustrated in FIG. 1 may be implemented by means of the operation at S104 illustrated in FIG. 2, which is described with reference to respective operations.

At S104, based on the number of latency cycles, a first load component in the at least one load component is activated, and an electric load value of the first load component is changed to adjust the adjustable latency, so as to control the second latency to be the integer multiple of the clock cycle.

Figure 3:
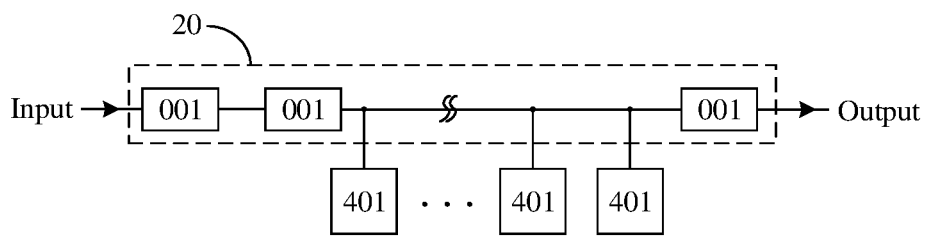
FIG. 3 is an explanatory diagram of a latency adjustment method according to an embodiment of the present disclosure.

In this embodiment of the present disclosure, as illustrated in FIG. 3, the second signal path 20 includes a plurality of circuit modules 001. These circuit modules 001 generate the physical latency. At least one load component 401 may be disposed in the second signal path 20, and each load component 401 is connected with the second signal path 20. After each load component 401 is activated, an electric load value of the load component is changed, resulting in a certain load latency, thereby affecting the second latency. The load latencies generated by respective load components 401 may be the same or different. The second latency includes the adjustable latency, and the adjustable latency includes latency generated by all of the load components 401.

In this embodiment of the present disclosure, the latency adjustment apparatus may determine, based on the number of latency cycles, the amount of adjustment to the adjustable latency that is required to cause the second latency to reach a target number of latency cycles, so as to determine the first load component that is required to be correspondingly activated in the at least one load component 401 to achieve the adjustment amount. Further, the latency adjustment apparatus may generate a corresponding load activation signal. Then the load activation signal is transmitted to the first load component to activate the first load component. The electric load value of the first load component is changed, to cause the first load component to generate the load latency, so as to adjust the adjustable latency, so that the second latency is controlled to be the integer multiple of the clock cycle. For example, if No. 6 to 9 load components are determined as first load components, the latency adjustment apparatus generates load activation signals $N_A<6:9>$, that is, the load activation signals are transmitted to the No. 6 to 9 load components, so as to activate the load components.

Correspondingly, in order to cause the second latency to reach the target number of latency cycles, the latency adjustment apparatus may also determine a second load component that is required to be deactivated correspondingly in the at least one load component 401. That is to say, the second load component has already in an activated state. Therefore, the latency adjustment apparatus may generate a corresponding load stop signal, transmit the load stop signal to the second load component to stop the activated state of the second load component, and change the electric load value of the second load component to cause the second load component to stop generating the load latency, so as to adjust the adjustable latency, so that the second latency is controlled to be the integer multiple of the clock cycle.

In this embodiment of the present disclosure, the load activation signal and the load stop signal may be at different electrical levels. The load activation signal is at a first electrical level, and the load stop signal is at a second electrical level. The latency adjustment apparatus may transmit the first electrical level to the first load component to activate the first load component. Correspondingly, the latency adjustment apparatus may also transmit the second electrical level to the second load component to stop the activated state of the second load component.

It is to be noted that, processes of activating the first load component and deactivating the second load component may be performed simultaneously or separately. That is to say, the latency adjustment apparatus may transmit the load activation signal and/or transmit the load stop signal according to requirements, so as to flexibly adjust the adjustable latency, which is not limited herein.

It should be understood that, by means of disposing the load component that may change the electric load value in the second signal path, and through controlling the load latency generated by the load component, a purpose of controlling the overall latency (that is, the second latency) of the second signal path can be achieved. In this way, different signal paths can be synchronized. Therefore, chip latency may meet design requirements, thereby reducing the risk of signal transmission errors in a chip.

Figure 2:
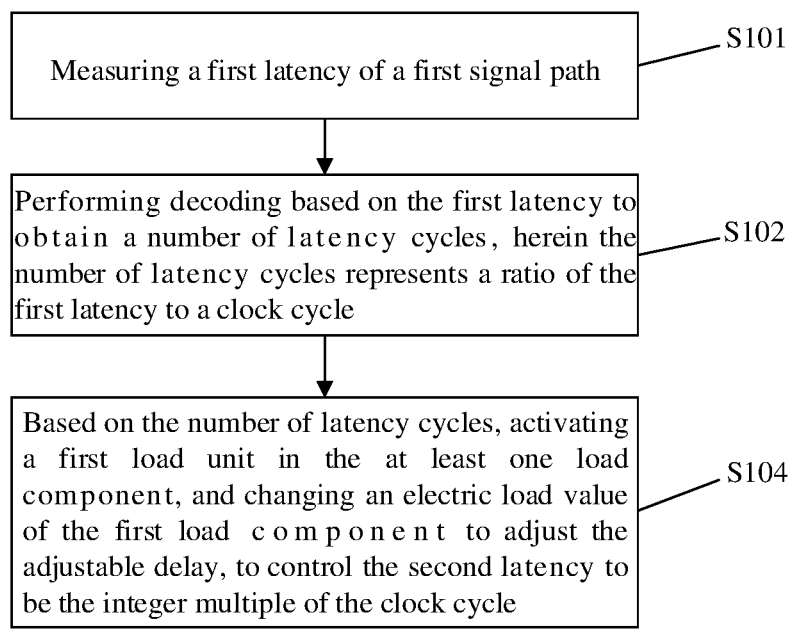
FIG. 2 is a second flowchart of a latency adjustment method according to an embodiment of the present disclosure.

In some embodiments of the present disclosure, the method for implementing the operation at S104 illustrated in FIG. 2 further includes the operations at S201 to S202, and is described with reference to each step.

At S201, a load activation signal is generated based on the number of latency cycles.

In this embodiment of the present disclosure, the latency adjustment apparatus may determine, based on the number of latency cycles, the adjustment amount that is required to cause the second latency to reach the target number of latency cycles, so as to determine the first load component that is required to be correspondingly activated in the at least one load component 401 to achieve the adjustment amount, and generate the corresponding load activation signal.

At S202, the load activation signal is transmitted to the first load component, to activate the first load component.

In this embodiment of the present disclosure, after generating the load activation signal, the latency adjustment apparatus may transmit the load activation signal to the first load component to activate the first load component, and change the electric load value of the first load component to cause the first load component to generate the load latency, so as to control the second latency to be the integer multiple of the clock cycle. For example, if the No. 6 to 9 load components are determined as the first load components, the latency adjustment apparatus transmits the load activation signals to the No. 6 to 9 load components, so as to activate the load components.

It should be understood that, according to situations of the load components, the first load component that is required to be activated is determined correspondingly, and the activation signal is transmitted to the first load component to activate the first load component. In this way, the accurate control of the load latency that is generated by each load component can be realized, so that a result of adjusting the second latency can be more accurate.

In some embodiments of the present disclosure, the second signal path further includes at least one shift register. The second latency further includes shift latency. The method for implementing the operation at S104 illustrated in FIG. 2 further includes the operation at S203, and is described with reference to each operation.

At S203, the at least one shift register is controlled to adjust the shift latency based on the number of latency cycles, so as to control the second latency to be a target integer multiple of the clock cycle.

In this embodiment of the present disclosure, the second signal path further includes at least one shift register. The shift register may shift, under the triggering of the clock signal, a signal transmitted in the second signal path, that is, adjust the shift latency in the second latency. Since the shift register is triggered by the clock signal, the adjustment amount of the shift latency is measured in clock cycle. That is, the adjustment amount of the shift latency is an integer multiple of the clock cycle. Therefore, after the shift latency is adjusted, the second latency can still be guaranteed to be the integer multiple of the clock cycle.

In this embodiment of the present disclosure, when the second signal path is the ODT path, the latency adjustment apparatus may control the shift register to adjust the shift latency, to control the ratio of the second latency to the clock cycle to be a value of CAS Write Latency (CWL) minus 2 (CWL−2), so as to meet requirements of memory specification such as Double Data Rate 4 (DDR4). Specifically, after decoding that the number of latency cycles corresponding to the first latency is N, the latency adjustment apparatus may adjust the adjustable latency in the second latency, to cause the ratio of the second latency to the clock cycle to be also N. Then, the latency adjustment apparatus may control the shift register to shift CWL minus 2 and further minus N (CWL−2−N) clock cycles, so that the ratio of the second latency to the clock cycle can meet the value of CWL minus 2(CWL−2).

It is to be noted that, in short, relevant provisions on ODT in the technical specification of DDR4 is that, in ODT, the resistance value of RTT may be switched, but the way of switching is required to follow a certain timing sequence. One mode is a synchronous ODT mode. That is, the resistance value of RTT is controlled according to a signal level state at an ODT pin on a memory chip, so as to implement impedance matching on a transmission line, thereby reducing the energy loss and reflection of the signal during transmission. ODT path latency is related to the value of the CWL, so that the ODT path latency is required to be controlled to meet a timing sequence requirement related to the CWL.

It should be understood that, the shift latency in the second latency can be adjusted by using the characteristic that the shift register can shift according to the clock cycle. In this way, in an aspect, synchronization between the signal paths is guaranteed, that is, the second latency is the integer multiple of the clock cycle; and in another aspect, the second latency can meet the design requirements.

Figure 4:
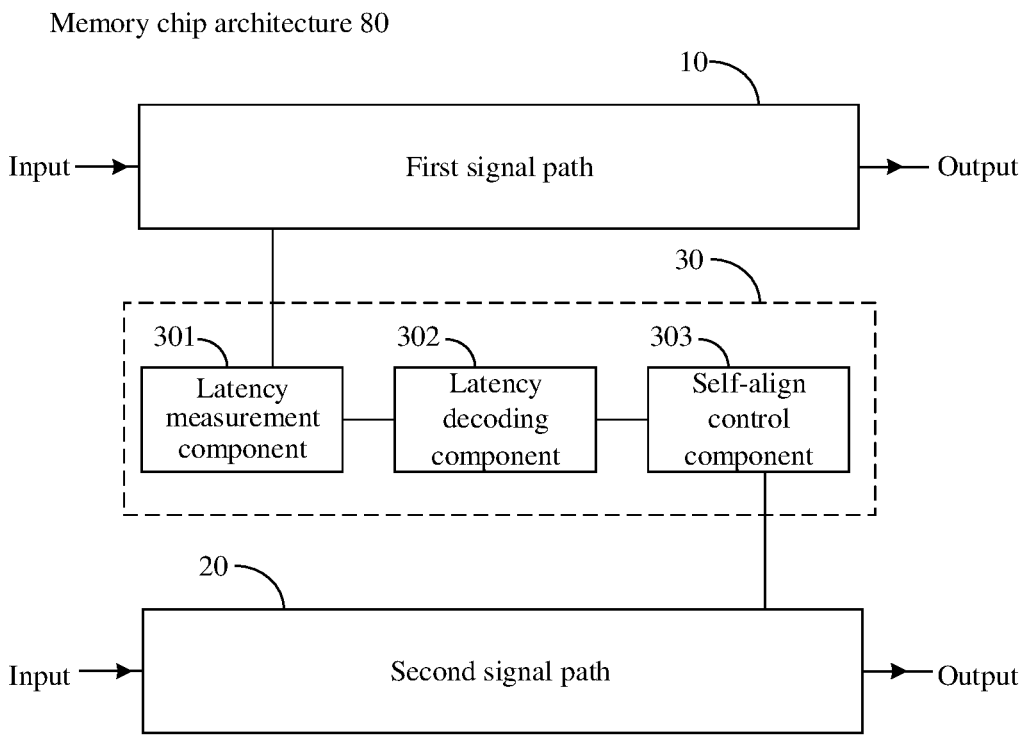
FIG. 4 is a first schematic structural diagram of a memory chip architecture according to an embodiment of the present disclosure.

FIG. 4 is an optional schematic structural diagram of a memory chip architecture according to an embodiment of the present disclosure. As illustrated in FIG. 4, the memory chip architecture 80 includes a first signal path 10, a second signal path 20 and a latency adjustment apparatus 30.

The latency adjustment apparatus 30 includes a latency measurement component (Measurement) 301, a latency decoding unit (Decoder) 302 and a self-align control component (Self-Align Control) 303. The latency measurement component 301 is connected with the first signal path 10, and is configured to measure the first latency of the first signal path 10. The latency decoding unit 302 is configured to receive the first latency from the latency measurement component 301, and perform decoding based on the first latency to obtain the corresponding number of latency cycles. The number of latency cycles represents a ratio of the first latency to a clock cycle. The self-align control component 303 is connected with the second signal path 20, and is configured to receive the number of latency cycles from the latency decoding unit 302, and control the second latency of the second signal path 20 to be an integer multiple of the clock cycle based on the number of latency cycles.

In this embodiment of the present disclosure, the latency measurement component 301 may measure the first latency of the first signal path 10, and transmit the first latency to the latency decoding unit 302. The latency decoding unit 302 may decode the first latency to obtain the number of latency cycles corresponding to the first latency, that is, a ratio of the first latency to a clock cycle. Since the first latency is the integer multiple of the clock cycle, the ratio of the first latency to the clock cycle is an integer N. The self-align control component 303 may adjust the second latency of the second signal path 20 by matching the number N of latency cycles of the first latency, so that the ratio of the second latency to the clock cycle is also an integer.

It should be understood that, the latency adjustment apparatus adjusts the second latency by matching the number of latency cycles of the first latency, so that the ratio of the second latency to the clock cycle is an integer. In this way, different signal paths can be synchronized. Therefore, chip latency may meet design requirements, thereby reducing the risk of signal transmission errors in a chip.

Figure 5:
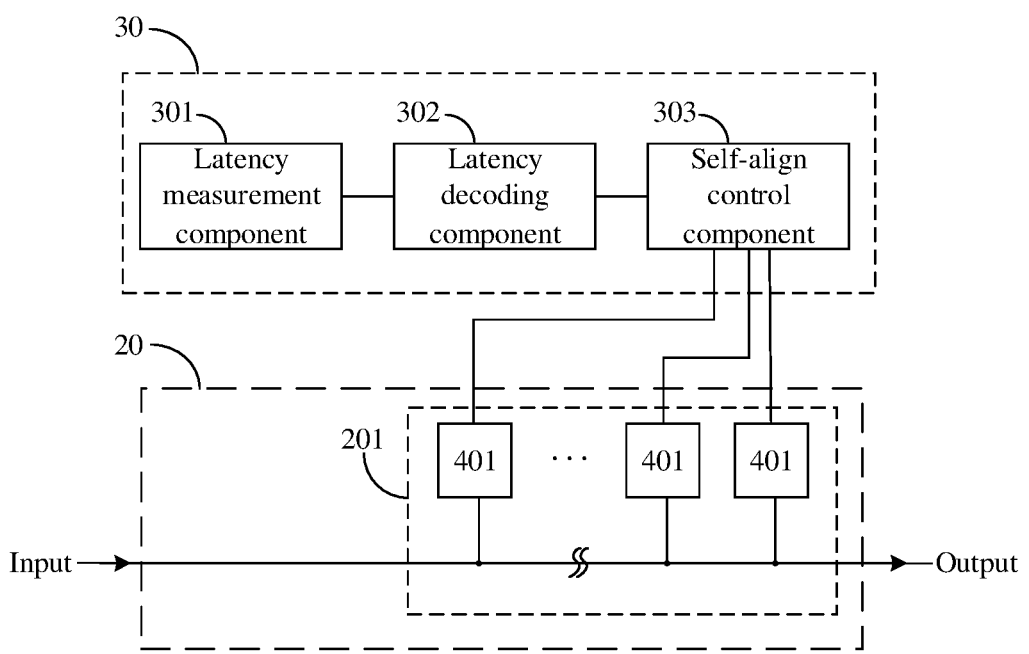
FIG. 5 is a second schematic structural diagram of a memory chip architecture according to an embodiment of the present disclosure.

In some embodiments of the present disclosure, as illustrated in FIG. 5, the second signal path 20 includes a latency control assembly 201. The latency control assembly 201 is configured to control the second latency of the second signal path 20 to be synchronized with the clock cycle. The latency control assembly 201 includes at least one load component 401. A load connection end of the at least one load component 401 is connected with any position of a main path in the latency control assembly 201.

In this embodiment of the present disclosure, the self-align control component 303 is further configured to generate a corresponding load activation signal based on the number of latency cycles, and transmit the load activation signal to the corresponding load component 401. The load component 401 is activated through being triggered by the corresponding load activation signal; and an electric load value is changed to adjust an adjustable latency in the second latency.

In this embodiment of the present disclosure, after each load component 401 is activated, the amount of adjustment to the second latency may be determined in advance. The self-align control component 303 may determine, according to the number of latency cycles of the first latency and the adjustment amount of each load component, which load component 401 should be activated to make the second latency adjusted to match the first latency. That is to say, a first load component that needs to be activated is determined. Then, the activation signal is transmitted to the first load component.

It should be understood that, by means of disposing the load component whose electric load value can be changed in the latency control assembly, the self-align control component may control the load latency generated by the load component, so that the overall latency (that is, the second latency) of the second signal path can be controlled. In this way, different signal paths can be synchronized. Therefore, chip latency may meet design requirements, thereby reducing the risk of signal transmission errors in a chip.

Figure 6:
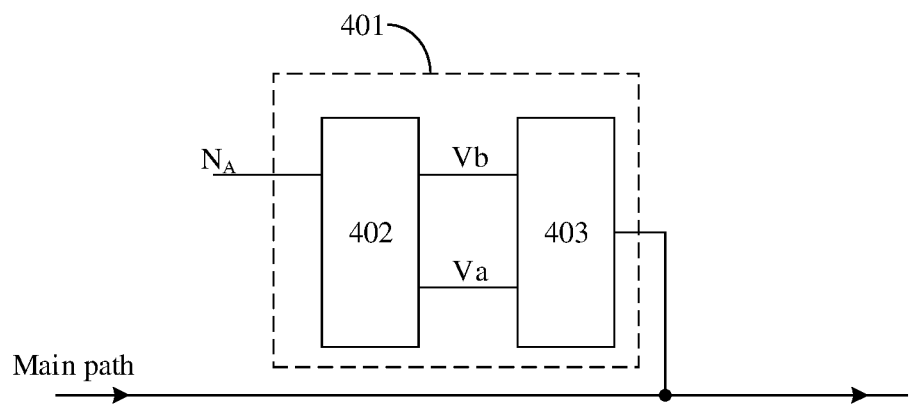
FIG. 6 is a third schematic structural diagram of a memory chip architecture according to an embodiment of the present disclosure.

In some embodiments of the present disclosure, as illustrated in FIG. 6, the load component 401 includes an input sub-component 402 and a capacitor sub-component 403. The input sub-component 402 is configured to receive the load activation signal $N_A$, and generate two control signals Va and Vb based on the load activation signal $N_A$. The capacitor sub-component 403 is connected with the input sub-component 402 and further connected to a main path of the latency control assembly. The capacitor sub-component 403 is configured to be activated through being triggered by the two control signals Va and Vb, and change the electric load value of the load component 401.

Figure 7:
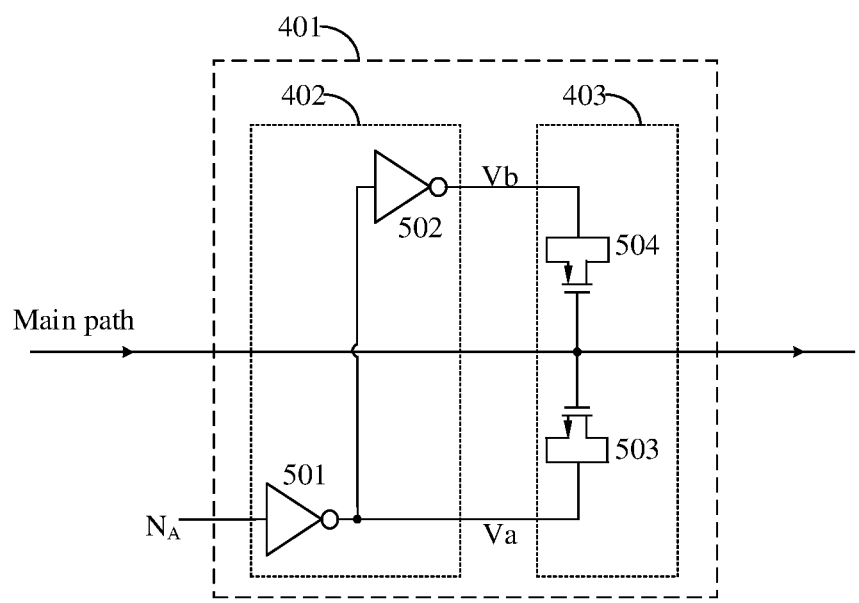
FIG. 7 is a fourth schematic structural diagram of a memory chip architecture according to an embodiment of the present disclosure.

In some embodiments of the present disclosure, as illustrated in FIG. 7, the input sub-component 402 includes a first inverter 501 and a second inverter 502. The first inverter 501 is configured to receive the load activation signal $N_A$, and output the first control signal Va in the two control signals. An input end of the second inverter 502 is connected with an output end of the first inverter 501, and the second inverter 502 is configured to output the second control signal Vb in the two control signals.

The capacitor sub-component 403 includes a first Metal-Oxide-Semiconductor (MOS) transistor 503 and a second MOS transistor 504. A source electrode and a drain electrode of the first MOS transistor 503 are both connected with the output end of the first inverter 501. A source electrode and a drain electrode of the second MOS transistor 504 are both connected with the output end of the second inverter 502. A gate electrode of the second MOS transistor 504 and a gate electrode of the first MOS transistor 503 are connected with each other and are commonly used as the load connection end of the load component 401, so as to be connected to the main path of the latency control assembly.

In this embodiment of the present disclosure, the first MOS transistor 503 and the second MOS transistor 504 are MOS transistors with different types. For example, the first MOS transistor 503 is an NMOS transistor, and the second MOS transistor 504 is a PMOS transistor. The first MOS transistor 503 and the second MOS transistor 504 form a capacitor unit (MOS CAP) together.

The load activation signal $N_A$ passes through the first inverter 501 and the second inverter 502, to obtain the first control signal Va and the second control signal Vb. Electrical levels of the first control signal Va and the second control signal Vb are opposite to each other, so that the first MOS transistor 503 and the second MOS transistor which are two MOS transistors with different types can be turned on simultaneously. For example, the first MOS transistor 503 is the NMOS transistor, and the second MOS transistor 504 is the PMOS transistor. The load component 401 receives the load activation signal $N_A$ at a high electrical level. After passing through the first inverter 501 and the second inverter 502, the first control signal Va is obtained to be at a low electrical level, and the second control signal Vb is obtained to be at a high electrical level. Further, the first MOS transistor 503 is turned on through being triggered by the first control signal Va, so as to form a gate capacitance to access the main path as capacitance load. Correspondingly, the second MOS transistor 504 is turned on through being triggered by the second control signal Vb, so as to form the gate capacitance to access the main path as the capacitance load. In this way, the load value of the load component 401 is changed, which affects the latency on the main path, that is, the second latency can be adjusted.

It should be understood that, two MOS transistors with different types are used to form the capacitor unit, and two inverters are used to respectively provide different electrical levels to the two MOS transistors, so that the two MOS transistors are turned on to form the gate capacitance to access the main path of the second signal path as the capacitance load, so as to adjust the second latency. In this way, different signal paths can be synchronized. Therefore, chip latency may meet design requirements, thereby reducing the risk of signal transmission errors in a chip.

Figure 8:
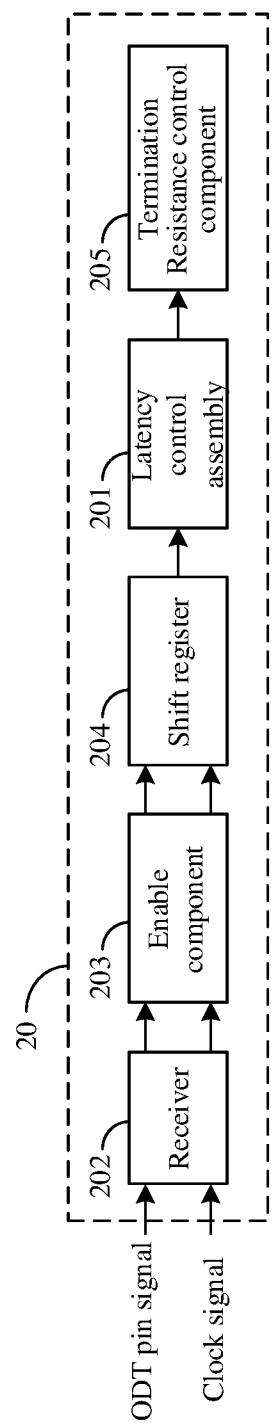
FIG. 8 is a fifth schematic structural diagram of a memory chip architecture according to an embodiment of the present disclosure.

In some embodiments of the present disclosure, as illustrated in FIG. 8, the second signal path 20 is an ODT path. The second signal path 20 further includes a receiver 202, an enable component 203, at least one shift register 204 and a RTT control component 205. The receiver 202 is configured to receive an ODT pin signal and a clock signal. The enable component 203 is connected with the receiver 202, and is configured to control an operating state of the second signal path 20. The at least one shift register 204 is connected with the enable component 203 and the latency control assembly 201, and is configured to generate and adjust a shift latency in the second latency. The RTT control component 205 is connected with the latency control assembly 201, and is configured to control the switching of the resistance value of RTT.

In this embodiment of the present disclosure, the first signal path uses a DLL path. The DLL path may lock the phase difference of the output signal and the input signal, and controls the output clock signal to delay an integer multiple of the clock cycle relative to the input clock signal. The ODT path used by the second signal path 20 is a very complex path. The ODT path includes physical latency (independent of the clock cycle) and clock latency (the latency is the integer multiple of the clock cycle). Since the latency (that is, the second latency) of the entire path is finally required to be the integer multiple of the clock cycle, the latency control assembly 201 plays a role of using the first latency of the DLL path (first signal path) to achieve the synchronization between a signal at the tail end of the ODT path and the clock signal. In this way, by means of compensating the physical latency, the latency of the entire path is the integer multiple of the clock cycle, so that the control of the resistance value of RTT can be finally achieved.

It should be understood that, by matching the DLL path, the physical latency of the ODT path is adjusted, so that PVT tolerance of the physical latency of the ODT path can be significantly improved. Therefore, different signal paths can be synchronized, thereby reducing the risk of signal transmission errors in a chip.

Figure 9:
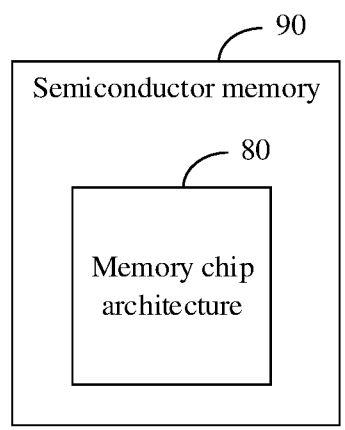
FIG. 9 is a schematic structural diagram of a semiconductor memory according to an embodiment of the present disclosure.

It is to be noted that, FIG. 9 is an optional schematic structural diagram of a semiconductor memory according to an embodiment of the present disclosure. As illustrated in FIG. 9, the semiconductor memory 90 includes a memory chip architecture 80.

In some embodiments of the present disclosure, the semiconductor memory 90 is a Synchronous Dynamic Random Access Memory (SDRAM) chip. The SDRAM chip conforms to a DDR4 memory specification.

It is to be pointed out here that the descriptions of the above memory and apparatus embodiments are similar to descriptions about the method embodiments and beneficial effects similar to those of the method embodiments are achieved. Technical details undisclosed in the storage medium and device embodiments of the present disclosure may be understood with reference to the descriptions about the method embodiments of the present disclosure.

It is to be noted that terms "include" and "comprise" or any other variant thereof is intended to cover nonexclusive inclusions herein, so that a process, method, object or apparatus including a series of components not only includes those components but also includes other components which are not clearly listed or further includes components intrinsic to the process, the method, the object or the apparatus. Under the condition of no more limitations, a component defined by the statement "including a/an . . . " does not exclude existence of the same other components in a process, method, object or apparatus including the component.

In several embodiments provided by the present disclosure, it is to be understood that the disclosed device and method may be implemented in other ways. The device embodiment described above is only schematic, and for example, division of the units is only logic function division, and other division manners may be adopted during practical implementation. For example, a plurality of units or components may be combined or integrated into another system, or some characteristics may be neglected or not executed. In addition, coupling or direct coupling or communication connection between each displayed or discussed component may be indirect coupling or communication connection, implemented through some interfaces, of the device or the units, and may be electrical and mechanical or adopt other forms.

The units described as separate parts may or may not be physically separated, and parts displayed as units may or may not be physical units, and namely may be located in the same place, or may also be distributed to multiple network units. Part of all of the units may be selected according to a practical requirement to achieve the purposes of the solutions of the embodiments.

In addition, each functional unit in each embodiment of the present disclosure may be integrated into a processing unit, each unit may also serve as an independent unit and two or more than two units may also be integrated into a unit. The integrated unit may be implemented in a hardware form and may also be implemented in form of hardware and software functional unit.

The above is only the implementations of the present disclosure and not intended to limit the scope of protection of the present disclosure. Any variations or replacements apparent to those skilled in the art within the technical scope disclosed by the present disclosure shall fall within the scope of protection of the present disclosure. Therefore, the protection scope of the present disclosure shall be subject to the protection scope of the claims.

INDUSTRIAL APPLICABILITY

The embodiments of the present disclosure provide the latency adjustment method, the memory chip architecture, and the semiconductor memory. The method includes: measuring a first latency of a first signal path; performing decoding based on the first latency to obtain a number of latency cycles, where the number of latency cycles represents a ratio of the first latency to a clock cycle; and controlling a second latency of a second signal path to be an integer multiple of the clock cycle based on the number of latency cycles. By means of the above method, the second latency can be adjusted by matching the number of latency cycles of the first latency, so that the ratio of the second latency to the clock cycle can be an integer. In this way, different signal paths can be synchronized. Therefore, chip latency may meet design requirements, thereby reducing the risk of signal transmission errors in a chip.

The invention claimed is:

1. A method for latency adjustment, comprising:
    measuring a first latency of a first signal path;
    performing decoding based on the first latency to obtain a number of latency cycles, wherein the number of latency cycles represents a ratio of the first latency to a clock cycle; and
    controlling a second latency of a second signal path to be an integer multiple of the clock cycle based on the number of latency cycles;
    wherein the second signal path comprises at least one load component, the second latency comprises an adjustable latency, and controlling the second latency of the second signal path to be the integer multiple of the clock cycle based on the number of latency cycles comprises:
    based on the number of latency cycles, activating a first load component in the at least one load component, and changing an electric load value of the first load component to adjust the adjustable latency, so as to control the second latency to be the integer multiple of the clock cycle.

2. The method of claim 1, wherein activating the first load component in the at least one load component based on the number of latency cycles comprises:
    generating a load activation signal based on the number of latency cycles; and
    transmitting the load activation signal to the first load component, to activate the first load component.

3. The method of claim 1, wherein the second signal path further comprises at least one shift register, the second latency further comprises a shift latency, and controlling the second latency of the second signal path to be the integer multiple of the clock cycle based on the number of latency cycles further comprises:
    controlling the at least one shift register to adjust the shift latency based on the number of latency cycles, so as to control the second latency to be the integer multiple of the clock cycle.

4. A memory chip architecture, comprising a first signal path, a second signal path and a latency adjustment apparatus, wherein the latency adjustment apparatus comprises:
    a latency measurement component, configured to measure a first latency of the first signal path;
    a latency decoding component, configured to perform decoding based on the first latency to obtain a number of latency cycles, wherein the number of latency cycles represents a ratio of the first latency to a clock cycle; and
    a self-align control component, configured to receive the number of latency cycles, and control a second latency of the second signal path to be an integer multiple of the clock cycle based on the number of latency cycles;
    wherein the first signal path is a Delay-Locked Loop (DLL) path.

5. The memory chip architecture of claim 4, wherein
    the self-align control component is further configured to generate a load activation signal based on the number of latency cycles.

6. The memory chip architecture of claim 5, wherein the second signal path comprises a latency control assembly;
    the latency control assembly is configured to control the second latency of the second signal path to be synchronized with the clock cycle; and
    the latency control assembly comprises at least one load component, a load connection end of the at least one load component is connected with any position of a main path in the latency control assembly, and the at least one load component is configured to be activated through being triggered by the load activation signal, to change an electric load value, so as to adjust an adjustable latency in the second latency.

7. The memory chip architecture of claim 6, wherein the load component comprises:
   an input sub-component, configured to receive the load activation signal, and generate two control signals based on the load activation signal; and
   a capacitor sub-component, connected with the input sub-component and configured to be activated through being triggered by the two control signals, and change the electric load value of the load component.

8. The memory chip architecture of claim 7, wherein the input sub-component comprises:
   a first inverter, configured to receive the load activation signal, and output a first control signal in the two control signals; and
   a second inverter, wherein an input end of the second inverter is connected with an output end of the first inverter, and the second inverter is configured to output a second control signal in the two control signals.

9. The memory chip architecture of claim 8, wherein the capacitor sub-component comprises:
   a first Metal-Oxide-Semiconductor (MOS) transistor, wherein a source electrode and a drain electrode of the first MOS transistor are both connected with the output end of the first inverter; and
   a second MOS transistor, wherein a source electrode and a drain electrode of the second MOS transistor are both connected with an output end of the second inverter, and a gate electrode of the second MOS transistor and a gate electrode of the first MOS transistor are connected with each other and are commonly used as the load connection end of the load component.

10. The memory chip architecture of claim 9, wherein the first MOS transistor is an NMOS transistor, and the second MOS transistor is a PMOS transistor.

11. The memory chip architecture of claim 6, wherein the second signal path comprises an On Die Termination (ODT) path, and the second signal path further comprises:
    a receiver, configured to receive an ODT pin signal and a clock signal;
    an enable component, connected with the receiver and configured to control an operating state of the second signal path;
    at least one shift register, connected with the enable component and the latency control assembly, and configured to generate and adjust a shift latency in the second latency; and
    a Termination Resistance (RTT) control component, connected with the latency control assembly, and configured to control a switching of a resistance value of RTT.

12. A semiconductor memory, comprising a memory chip architecture, wherein the memory chip architecture comprises a first signal path, a second signal path and a latency adjustment apparatus, and the latency adjustment apparatus comprises:
    a latency measurement component, configured to measure a first latency of the first signal path;
    a latency decoding component, configured to perform decoding based on the first latency to obtain a number of latency cycles, wherein the number of latency cycles represents a ratio of the first latency to a clock cycle; and
    a self-align control component, configured to receive the number of latency cycles, and control a second latency of the second signal path to be an integer multiple of the clock cycle based on the number of latency cycles;
    wherein, the self-align control component is further configured to generate a load activation signal based on the number of latency cycles.

13. The semiconductor memory of claim 12, wherein the second signal path comprises a latency control assembly;
    the latency control assembly is configured to control the second latency of the second signal path to be synchronized with the clock cycle; and
    the latency control assembly comprises at least one load component, a load connection end of the at least one load component is connected with any position of a main path in the latency control assembly, and the at least one load component is configured to be activated through being triggered by the load activation signal, to change an electric load value, so as to adjust an adjustable latency in the second latency.

14. The semiconductor memory of claim 13, wherein the load component comprises:
    an input sub-component, configured to receive the load activation signal, and generate two control signals based on the load activation signal; and
    a capacitor sub-component, connected with the input sub-component and configured to be activated through being triggered by the two control signals, and change the electric load value of the load component.

15. The semiconductor memory of claim 14, wherein the input sub-component comprises:
    a first inverter, configured to receive the load activation signal, and output a first control signal in the two control signals; and
    a second inverter, wherein an input end of the second inverter is connected with an output end of the first inverter, and the second inverter is configured to output a second control signal in the two control signals.

16. The semiconductor memory of claim 12, wherein the semiconductor memory is a Synchronous Dynamic Random Access Memory (SDRAM) chip.

17. The semiconductor memory of claim 16, wherein the SDRAM chip conforms to a Double Data Rate 4 (DDR4) memory specification.

* * * * *